US007709728B2

(12) United States Patent
Walukiewicz et al.

(10) Patent No.: US 7,709,728 B2
(45) Date of Patent: May 4, 2010

(54) MULTIBAND SEMICONDUCTOR COMPOSITIONS FOR PHOTOVOLTAIC DEVICES

(75) Inventors: Wladyslaw Walukiewicz, Kensington, CA (US); Kin Man Yu, Lafayette, CA (US); Junqiao Wu, Belmont, MA (US)

(73) Assignee: The Regents of the University of California, Oakland, CA (US)

( * ) Notice: Subject to any disclaimer, the term of this patent is extended or adjusted under 35 U.S.C. 154(b) by 1200 days.

(21) Appl. No.: 10/999,456

(22) Filed: Nov. 29, 2004

(65) Prior Publication Data

US 2006/0112984 A1 Jun. 1, 2006

(51) Int. Cl.
*H01L 25/00* (2006.01)
*H01L 31/00* (2006.01)
(52) U.S. Cl. .................. 136/243; 136/252; 136/258
(58) Field of Classification Search ................ 257/102, 257/442
See application file for complete search history.

(56) References Cited

U.S. PATENT DOCUMENTS

| 5,432,374 | A | * | 7/1995 | Norton | .................. | 257/442 |
| 6,256,331 | B1 | * | 7/2001 | Kitoh et al. | .............. | 372/46.01 |
| 2004/0155255 | A1 | * | 8/2004 | Yamamoto et al. | .......... | 257/102 |

OTHER PUBLICATIONS

Liu et al. ("Optical properties of epitaxial ZnMnTe and ZnMgTe films for a wide range of alloy compositions," Journal of Applied physics, vol. 91, N5, Mar. 2002, pp. 2859-2865).*

Forrest et al. ("The coming of Molecular Optoelectronics", Society of Vacuum coaters, 44th Annual Technical Conference Proceedings, Philadelphia, Apr. 21-26, 2001, pp. 3-6.).*

K.M. Yu et al., Synthesis and optical properties of II-O-VI highly mismatched alloys, Jun. 2004, J of Applied Physics, vol. 25, No. 11, pp. 6232-6238.*

Aspnes: "Third-derivative modulation spectroscopy with low-field electroreflectance", *Surface Sci.* 37 (1973), pp. 418-442.

Kurtz, et al.: "Projected Performance of three- and four-junction devices using GaAs and GaInP", *26th IEEE Conf.*, 1977, California.

Luque, et al.: "Increasing the efficiency of ideal solar cells by photon induced transitions at intermediate levels", *Phys. Review Let.* 78 No. 26 (1997), pp. 5014-5017.

Shan, et al.: "Band anticrossing in GaInNAs alloys", *Phys. Review Let.* 82 No. 6 (1999), pp. 1221-1224.

(Continued)

*Primary Examiner*—Alexa D Neckel
*Assistant Examiner*—Shannon Gardner
(74) *Attorney, Agent, or Firm*—Fulbright & Jaworski, LLP

(57) ABSTRACT

The highly mismatched alloy $Zn_{1-y}Mn_yO_xTe_{1-x}$, $0 \leq y < 1$ and $0 < x < 1$ and other Group II-IV-Oxygen implanted alloys have been synthesized using the combination of oxygen ion implantation and pulsed laser melting. Incorporation of small quantities of isovalent oxygen leads to the formation of a narrow, oxygen-derived band of extended states located within the band gap of the $Zn_{1-y}Mn_yTe$ host. With multiple band gaps that fall within the solar energy spectrum, $Zn_{1-y}Mn_yO_xTe_{1-x}$ is a material perfectly satisfying the conditions for single-junction photovoltaics with the potential for power conversion efficiencies surpassing 50%.

18 Claims, 8 Drawing Sheets

OTHER PUBLICATIONS

Walukiewitcz, et al.: "Internaction of localized electronic states with the conduction band: band anticrossing in II-VI semiconductor ternaries", *Phys. Review Let.* 85 No. 7 (2000), pp. 1552-1555.

Wolf: "Limitations and possibilities for improvement of photovoltaic solar energy converters", *Proc. of IRE* (Jul. 1960) pp. 1246-1263.

Yamaguchi: "III-V compound multi-junction solar cells: present and future", *Solar Energy* 75 (2003), pp. 261-269.

Yu, et al.: "Band anticrossing in group II-$O_x$-$VI_{1-x}$ highly mismatched alloys [..]", *Applied Phys. Let.* 80 No. 9 (2002), pp. 1571-1573.

Yu, et al.: "Synthesis of $GaN_xAs_{1-x}$ thin films by pulsed laser melting and rapid thermal annealing of $N^+$-implanted GaAs", *J. Applied Phys.* 94 No. 2 (2003), pp. 1043-1049.

Chiang, et al. "Experimental results of $GaInP_2$/GaAs/Ge triple junction cell development for space power systems", *25th PVSC*, May 13-17, 1996; Washington D.C., pp. 183-186.

King, et al. "High-voltage, low-current GaInP/GaInP/GaAs/GaInNAs/Ge Solar Cells", (2002) *IEEE*, pp. 852-855.

Olson, et al. "$GaInP_2$/GaAs: a current- and lattice-matched tandem cell with a high theoretical efficiency" (1985) *IEEE*, pp. 552-555.

Yu, et al. "Enhanced nitrogen incorporation by pulsed laser annealing of $GaN_xAs_{1-x}$ formed by N ion implantation", *Applied Phys. Letters*, 80, No. 21 (2002), pp. 3958-3960.

\* cited by examiner

MULTIBAND SEMICONDUCTOR COMPOSITIONS FOR PHOTOVOLTAIC DEVICES

STATEMENT REGARDING FEDERALLY SPONSORED RESEARCH OR DEVELOPMENT

The invention described and claimed herein was made in part utilizing funds supplied by the United States Department of Energy under contract No. DE-AC03-76SF000-98 between the U.S. Department of Energy and The Regents of the University of California. The government has certain rights to the invention.

BACKGROUND OF THE INVENTION

This invention relates to new materials for photovoltaic devices and more specifically multiband semiconductors for high power conversion efficiency solar cells.

Various materials that are suitable for photovoltaic devices are known, such as tetrahedral amorphous semiconductors (e.g., amorphous silicon, amorphous silicon germanium and amorphous silicon carbide) as well as poly- and mono-crystalline semiconductors including group IV (Si), II-VI compound semiconductors, (e.g., CdTe), and III-V group compound semiconductors. (e.g., GaAs, GaInP, GaAlAs). A conventional solar utilizes the pn junction formed by ion implantation or thermal diffusion of impurities into a substrate of single crystal of silicon (Si) or gallium arsenide (GaAs), or by epitaxial growth of an impurity-doped layer on a substrate of such single crystal. However, such single junction solar cells have only limited efficiency because they are sensitive to a limited part of the total solar spectrum. The efficiency can be improved by using stacks of p/n junctions formed with semiconductors with different energy gaps that are sensitive to different parts of solar spectrum. This concept has been realized in multijunction or tandem solar cells (J. M. Olson, T. A. Gessert, and M. M. Al-Jasim, *Proc. 18th IEEE Photovoltaic Specialists Conference*, 552, Las Vegas, Oct. 21-25, 1985, the contents of which are incorporated by reference in its entirety) such as GaAs/GInP double junction or Ge/GaAs/GaInP triple junction cells. Power conversion efficiencies of 37% have been achieved in the most advanced versions of such cells. The complexity of the design and high fabrication costs limit the use of such cells to space applications (M. Yamaguchi, *Solar Energy Mat. & Solar Cells*, 75, 261 (2003).).

Another approach to improve the efficiency of solar cells has been based on the concept of multiband semiconductors (M. Wolf, Proc. IRE, 48, 1246 (1960) and A. Luque and A. Marti., Phys. Rev. Lett., 78, 5014 (1997). It has been postulated that instead of using several semiconductors with different band gaps one could use a single semiconductor with several absorption edges that absorb photons from different parts of the solar spectrum. The most important advantage of this design of high efficiency solar cells is that they require only a single p/n junction considerably simplifying the cell design and lowering the production costs. It has been theoretically predicted that ideal power conversion efficiencies up to 63% and 72% could be achieved in solar cells fabricated using materials with optimized three and four energy bands, respectively.

Practical realization of a multiband semiconductor that could be used for solar cells has turned out to be extremely difficult. There were several attempts to intentionally introduce large concentrations of impurities or defects that would form an additional narrow band in the band gap of a standard semiconductor such as Si or GaAs. These attempts were not successful as the impurities and defects changed the key electrical properties of the materials making preparation of properly operating solar cells impossible. To date there has been no confirmed demonstration of an operational solar cell based on the concept of multiband semiconductors.

Recently a new class of semiconductors has emerged, whose fundamental properties are dramatically modified through the substitution of a relatively small fraction of host atoms with an element of very different electronegativity, the so called highly mismatched alloys (HMAs). III-V alloys in which group V anions are partially replaced with the isovalent N [Semiconductor Science and Technology 17, 2002, Special Issue: III-N-V Semiconductor Alloys, the contents of which are hereby incorporated by reference in its entirety] or II-VI alloys in which group VI anions are partially replaced with O [K. M. Yu, W. Walukiewicz, J. Wu, J. W. Beeman, J. W. Ager, E. E. Haller, I. Miotkowski, A. K. Ramdas, and P. Becla, Appl. Phys. Lett. 80, 1571 (2002), the contents of which are hereby incorporated by reference in its entirety,] are the well known examples of the HMAs. For example, $GaN_xAs_{1-x}$ exhibits a strong reduction of the band gap by 180 meV when only 1% of the As atoms is replaced by N. It has been predicted and experimentally demonstrated that the electronic band structure of such HMAs is determined by the anticrossing interaction between localized O or N states and the extended states of the semiconductor matrix [W. Walukiewicz, W. Shan, K. M. Yu, J. W. Ager III, E. E. Haller, I. Miotlowski, M. J. Seong, H. Alawadhi, and A. K. Ramdas, Phys. Rev. Lett. 85, 1552 (2000), the contents of which are hereby incorporated by reference in its entirety]. The interaction splits the conduction band into two nonparabolic subbands: $E_+$ and $E_-$.

BRIEF SUMMARY OF THE INVENTION

The present invention provides a new class of multiband gap semiconductor materials. This class of multiband material can be used for the design of high efficiency solar cells. In one embodiment the materials in accordance with the present invention comprise group II-VI compound semiconductor in which a fraction of the group VI atoms have been replaced with oxygen atoms forming $II-O_x-VI_{1-x}$ alloys. In one embodiment the materials can be fabricated using ion implantation followed by pulsed laser melting and/or thermal annealing. In another embodiment the materials can be also synthesized as epitaxial films using Pulsed Laser Deposition and a variety of epitaxial growth techniques including Molecular Beam Epitaxy and Metalorganic Chemical Vapor Deposition. In one embodiment the solar cells are fabricated by forming a single p/n junction in the aforementioned materials.

BRIEF DESCRIPTION OF THE DRAWINGS

The present invention will be readily understood by the following detailed description in conjunction with the accompanying drawings.

DETAILED DESCRIPTION OF THE PREFERRED EMBODIMENTS

Figure 1:
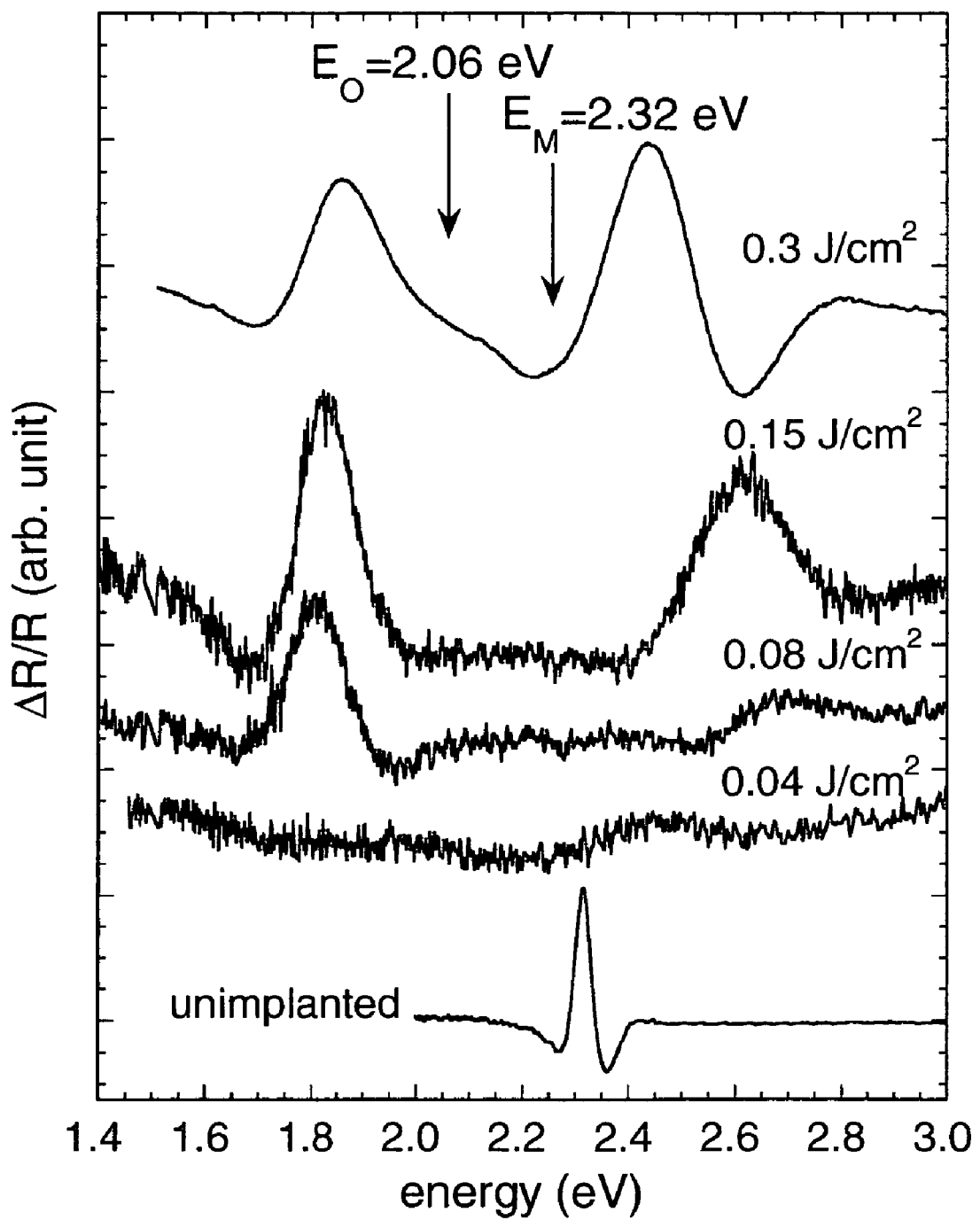
FIG. 1 displays photomodulated reflectance (PR) spectra obtained from a series of 3.3% $O^+$-implanted $Zn_{0.88}Mn_{0.12}Te$ samples followed by pulsed laser melting with increasing energy fluence from 0.04-0.3 $J/cm^2$. The PR spectrum from an as-grown $Zn_{0.88}Mn_{0.12}Te$ crystal is also shown for comparison. Two absorption edges from the valence band edge to the lower and upper conduction band edges are observed demonstrating the formation of an additional conduction band.

Reference will now be made in detail to some specific embodiments of the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention. All references cited herein are expressly incorporated herein by reference in their entirety for all purposes.

In this specification and the appended claims, the singular forms "a," "an," and "the" include plural reference unless the context clearly dictates otherwise. Unless defined otherwise, all technical and scientific terms used herein have the same meaning as commonly understood to one of ordinary skill in the art to which this invention belongs.

In one embodiment of the present invention there is disclosed a semiconductor composition comprising a ternary or quaternary alloy, said alloy comprising a Group II element, a Group VI element, Oxygen and optionally a third element "A", wherein said alloy has a mole fraction composition of (Group II)$_{(1-y)}$(A)$_y$O$_x$(Group VI)$_{(1-x)}$, and $0 \leq y < 1$ and $0 < x < 1$ and "A" comprises Mg. In one embodiment there is disclosed an alloy comprising $Zn_{0.88}A_{0.12}O_xTe_{1-x}$, where $0 < x < 0.05$. Preferably x is between about 0.01 and 0.05.

In another embodiment there is contemplated $Cd_{1-y}Mg_yO_xTe_{1-x}$, $0 < y < 1$ and $0 < x < 0.05$, preferably x is between about 0.01 and 0.05.

In another embodiment of the present invention there is disclosed a semiconductor composition comprising a ternary or quaternary alloy, said alloy comprising a Group II element, a Group VI element, Oxygen and optionally a third element "A", wherein said alloy has a mole fraction composition of (Group II)$_{(1-y)}$(A)$_y$O$_x$(Group VI)$_{(1-x)}$, and $0 \leq y < 1$ and $0 < x < 0.05$ and "A" comprises either Mn or Mg, and wherein the Group II element does not comprise Cd. Preferably x is between about 0.01 and 0.05.

In another embodiment of the present invention there is disclosed a semiconductor composition comprising a ternary or quaternary alloy comprising a Group II element, optionally another Group II element "A", S or Se, Oxygen and Tellurium, wherein said alloy has a mole fraction composition of (Group II)$_{(x)}$(A)$_{(1-x)}$(S or Se)$_{(1-y-z)}$(Te)$_{(y)}$(O)$_z$, and $0 < x \leq 1$, $0 < z < 0.10$ and $0 < y < 0.2$) as well as their use in photovoltaic devices. The concept of the multiband materials for photovoltaic applications can be extended to a four bands in ZnSeOTe alloys in which two additional bands, one related to Te located close to the valence band and another one related to O and located close to the conduction band, are formed. In a preferred embodiment of the present invention there is contemplated $Zn_xMn_{1-x}Se_{(1-y-z)}Te_yO_z$ where $0 < x \leq 1$, $0 < z < 0.04$ and $0 < y < 0.2$).

In another embodiment of the present invention there is disclosed a semiconductor composition comprising an alloy comprising $GaN_xAs_{1-x-y}P_y$ wherein $0.3 \leq y < 0.5$ and $0 < x < 0.05$.

In another embodiment of the present invention there is disclosed semiconductor composition comprising an alloy comprising $Ga_{1-y}In_yN_xP_{1-x}$ wherein $0.4 \leq y < 0.6$ and $0 < x < 0.05$.

All of the compositions disclosed herein are suitable for films for use in photovoltaic devices.

By "Group II-VI" compounds and their alloys it is meant to include all compound semiconductor materials composed such as ZnTe, CdTe and all other binary, ternary and quaternary alloys of the respective Group elements. Group II elements include Mn, Mg, Zn and Cd. Group VI elements include O, S, Se, and Te. Group III elements include B, Al, Ga, In and Tl. Group V elements include N, P, As, and Sb.

It is understood that the present invention includes semiconductor materials which are doped or undoped (i.e. pure intrinsic semiconductors) and may be arranged to form a variety of semiconductor devices with junctions such as pn, pnp, npn, pin, pip and so forth. In certain embodiments the materials can be doped in a conventional manner. For example, conventional dopants such as B, P, As, In and Al can be used. Dopants may be selected from Groups II, III, IV, V, VI, etc.

As a non-limiting example of one embodiment of the present invention, multiple energy implantation using 90 and 30 keV O⁺ was carried out into $Zn_{1-y}Mn_yTe$ (y=0 and 0.12) single crystals to form ~0.2 μm thick layers with relatively constant O concentrations corresponding to O mole fractions of 0.0165-0.044. Note that the present invention contemplates that Mn may be replaced with Mg. The O⁺-implanted samples were pulsed-laser melted in air using a KrF laser (λ=248 nm) with a FWHM pulse duration ~38 ns, as described in K. M. Yu, W. Walukiewicz, M. A. Scarpulla, O. D. Dubon, J. Jasinski, Z. Liliental-Weber, J. Wu, J. W. Beeman, M. R. Pillai, and M. J. Aziz, J. Appl. Phys. 94, 1043

(2003), the contents of which are hereby incorporated by reference in its entirety. After passing through a multi-prism homogenizer, the fluence at the sample ranged between 0.020 and 0.3 J/cm². Some of the samples underwent RTA after the PLM at temperatures between 300 and 700° C. for 10 seconds in flowing $N_2$.

The semiconductor compositions of the present invention are useful in photovoltaic applications. Efforts to improve the efficiency of solar cells have led to extensive experimental and theoretical studies of new materials and cell designs. To date, the highest power conversion efficiency of ~37% have been achieved with multijunction solar cells based on standard semiconductor materials, see P. K. Chiang et al., Proc. 25th IEEE Photovoltaic Specialists Conference (IEEE New York, 1996) pp. 183; and S. R. Kurtz et al., Proc. 26th IEEE Photovoltaic Specialists Conf., (IEEE, New York, 1997) p 875 and R. R. King et al., Proc. 29th IEEE Photovoltaic Specialists Conf., New Orleans, 2002 (IEEE, New York, 2002) pp. 852-5, the contents of all three of which are hereby incorporated herein by reference in their entirety.

Figure 4:
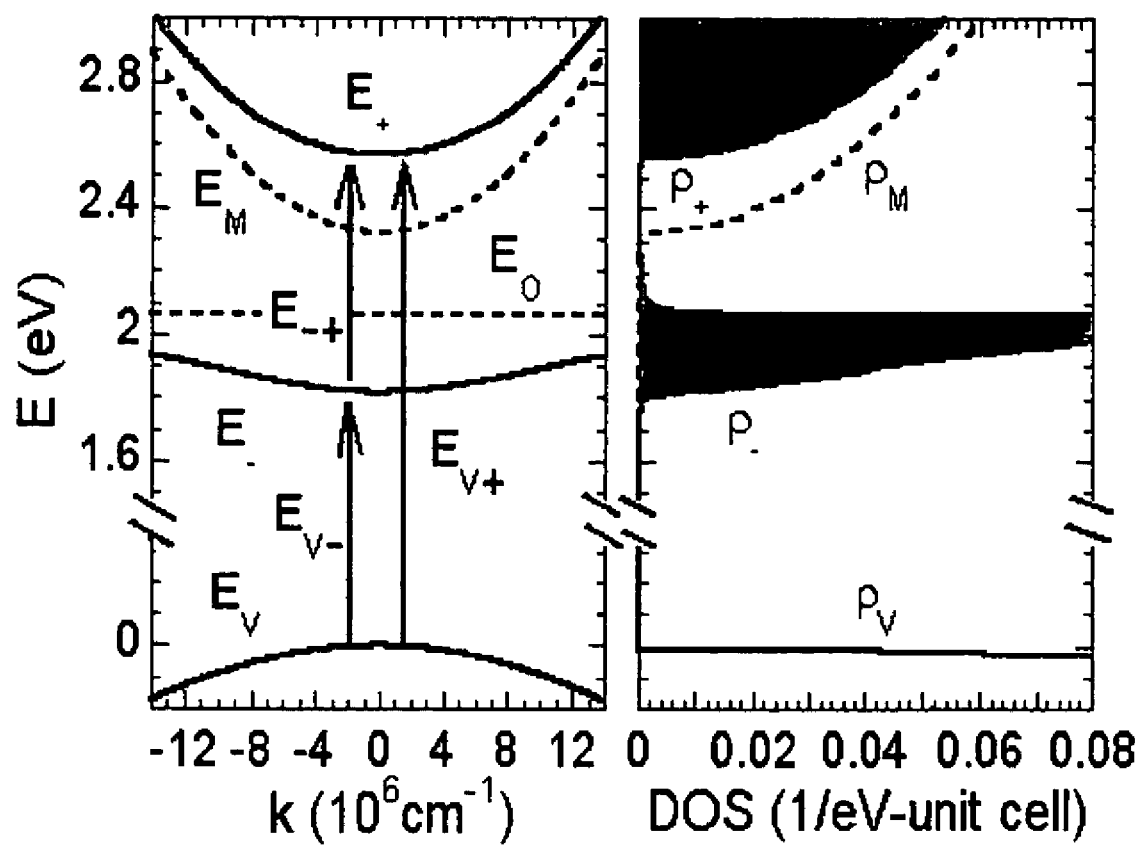
FIG. 4 schematically displays the optical transitions between different bands in $Zn_{0.88}Mn_{0.12}O_xTe_{1-x}$ with x~0.02. The calculated energy band structure (left panel) and density of states (right panel). The three possible optical transitions are indicated in the right panel. The lower (higher) energy peak in FIG. 1 corresponds to $E_{v-}$ ($E_{v+}$) transitions.

With multiple band gaps that fall within the solar energy spectrum, $Zn_{1-y}Mn_yO_xTe_{1-x}$ provides an excellent material for a solar cell. FIG. 1 shows a series of PR spectra from $Zn_{0.88}Mn_{0.12}Te$ samples implanted with 3.3% of $O^+$ followed by PLM with increasing laser energy fluence from 0.04 to 0.3 J/cm². Two optical transitions at ~1.8 and 2.6 eV, distinctly different from the fundamental band gap transition ($E_M$=2.32 eV) of the matrix, can be clearly observed from the samples after PLM with fluences≧0.08 J/cm². Identical PLM treatments on unimplanted and $Ne^+$-implanted ZnMnTe samples do not show such transitions indicating that they are not caused by the implantation damage. These results suggest that $Zn_{0.88}Mn_{0.12}O_xTe_{1-x}$ layers are formed after $O^+$-implantation and PLM with energy fluence≧0.08 J/cm². The two optical transitions can be attributed to transitions from the valence band to the two conduction subbands, $E_+$ (~2.6 eV) and $E_-$ (~1.8 eV) formed as a result of the hybridization of the localized O states and the extended conduction band states of ZnMnTe. The strong signals at both $E_-$ and $E_+$ indicates the extended nature of these electronic states and the substantial oscillator strength for the transitions. The energy band structure and the density of states for the case of $Zn_{0.88}Mn_{0.12}O_xTe_{1-x}$ alloy (with x~0.01) are shown in FIG. 4. An O derived narrow band of extended states $E_-$ is separated from the upper subband $E_+$ by about 0.7 eV. Three types of optical transitions are possible in this band structure; (1) from the valence band to the $E_+$ subband, $E_{V+}=E_+(k=0)-E_V(k=0)=$ 2.56 eV, (2) from the valence band to $E_-$ subband, $E_{V-}=E_-(k=0)-E_V(k=0)=1.83$ eV and (3) from $E_-$ to $E_+$, $E_{+-}=E_+(k=0)-E_-(k=0)=0.73$ eV. These three absorption edges span much of the solar spectrum, thus these alloys are good candidates for the multi-band semiconductors envisioned for high efficiency photovoltaic devices.

Figure 2:
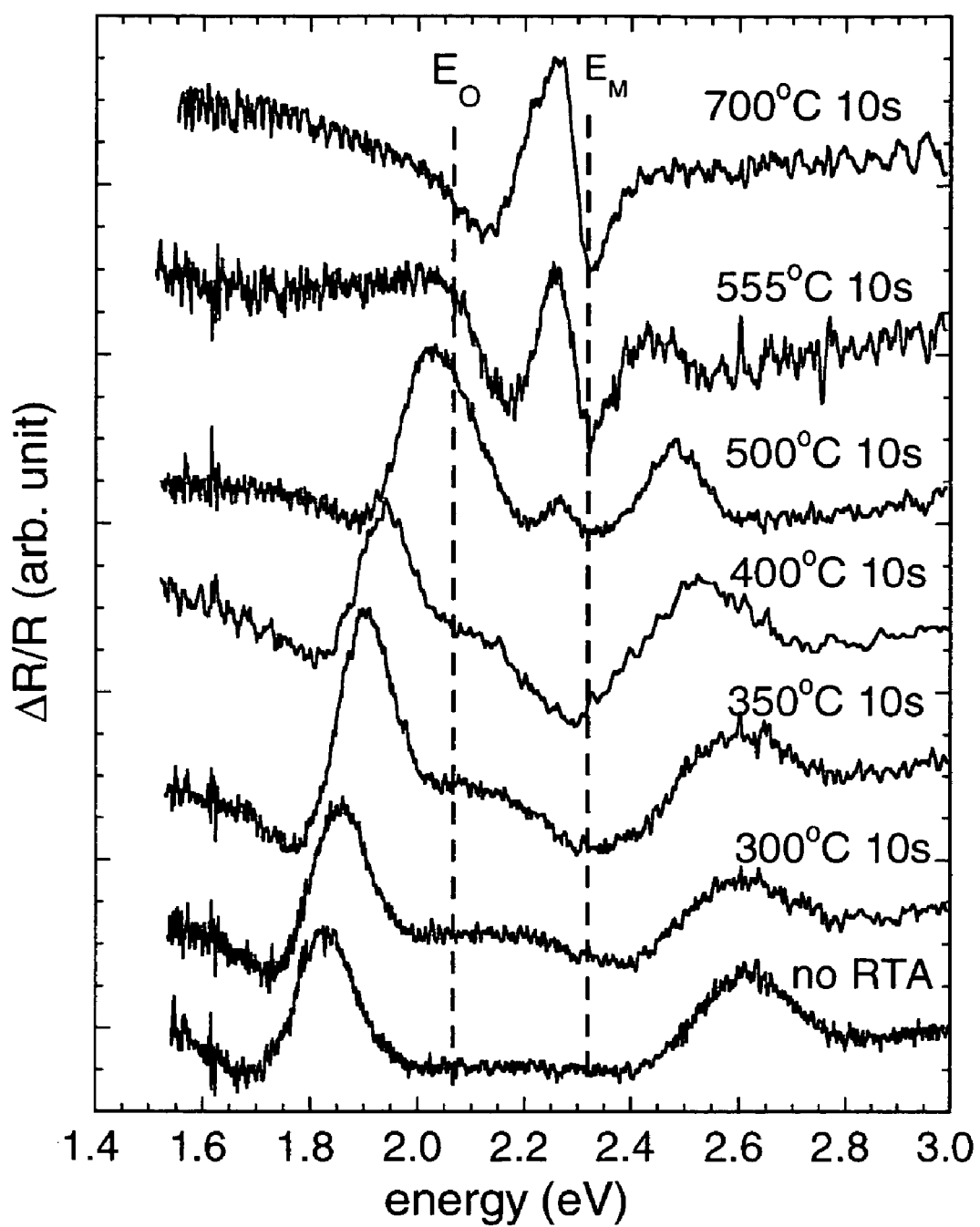
FIG. 2 shows a series of PR spectra from the 3.3% O⁺-implanted $Zn_{0.88}Mn_{0.12}Te$ samples after PLM with fluence=0.15 J/cm² followed by RTA for 10 s at temperatures between 300 and 700° C.

FIG. 2 shows a series of PR spectra from the 3.3% $O^+$-implanted $Zn_{0.88}Mn_{0.12}Te$ samples after PLM with fluence=0.15 J/cm² followed by RTA for 10 s at temperatures between 300 and 700° C. A reduction in the energy shifts of both $E_-$ and $E_+$ can be observed at RTA temperature higher than 350° C. This indicates that the $Zn_{0.88}Mn_{0.12}O_xTe_{1-x}$ alloys are thermally stable up to ~350° C. At an RTA temperature of 700° C., only the original $E_M$ transition is observed. This may suggest that the O atoms that resided in the Te sites diffused out of the Te sites, possibly forming O bubbles. It is also worth noting that the BAC model predicts that as the $E_-$ transition approaches the localized O level, as in the case of the samples after RTA at temperatures between 400 and 555° C., the nature of the lowest subband minimum becomes more localized-like. This can account for the observed broadening of the transition in FIG. 2.

Figure 3:
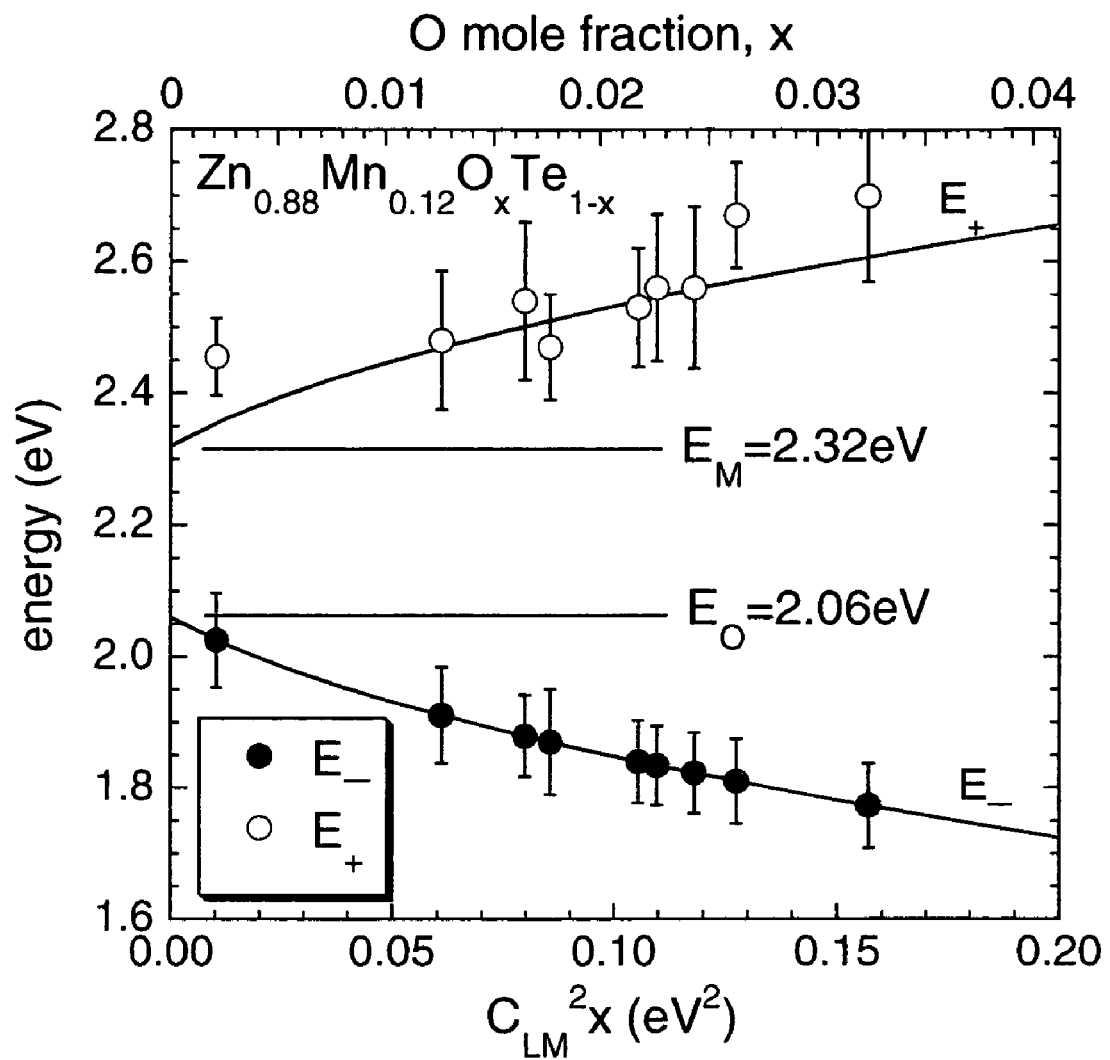
FIG. 3 shows the energy positions of $E_-$ and $E_+$ for the $Zn_{0.88}Mn_{0.12}O_xTe_{1-x}$ alloys with different x.

The energy positions of $E_-$ and $E^+$ for the $Zn_{0.88}Mn_{0.12}O_xTe_{1-x}$ alloys with different x are plotted in FIG. 3. Data taken from samples implanted with different amount of O (1.65, 2.2 and 4.4%) as well as PLM with different energy fluences are also plotted on FIG. 3. We note here that x decreases with increasing energy fluence higher than the melt threshold (~0.08 J/cm²); possibly due to the longer melt duration and/or dilution through the deeper melt depth. The energy positions of the two transitions as predicted by the BAC model are plotted as solid lines. Here, since the values of x were calculated from the $E_-$ transition no error bars are given for $E_-$. Given the broad linewidths of the $E_+$ transitions, they agree reasonably well with the calculated values for samples with various O mole fractions.

The process of annealing may be accomplished by thermal annealing (TA) through heating or pulsed laser melting (PLM). It is understood that the terms PLA (pulsed laser annealing) and PLM (pulsed laser melting) are used to describe the same annealing phenomena process in semiconductors. The thermal annealing is performed at a temperature that is lower than the melting point of the wafer semiconductor. Generally the temperature is between 500 and 1200° C. for time duration of seconds. Pulsed laser annealing was accomplished according to Yu et al. Applied Physics Letters Vol. 80, No. 21, 3958-3960 (2000), the contents of which are incorporated by reference in its entirety.

To demonstrate the efficiency of the semiconductor compositions of the present invention in solar cell applications the solar cell power conversion efficiency for the material has been calculated with the electronic band structure shown in FIG. 4. Even for this non-optimal band gap configuration we calculate a power conversion efficiency of 45%, which is higher than the ideal efficiency of any solar cell based on a single junction in a single-gap semiconductor and is comparable to the efficiency of triple-junction cells.

Figure 5:
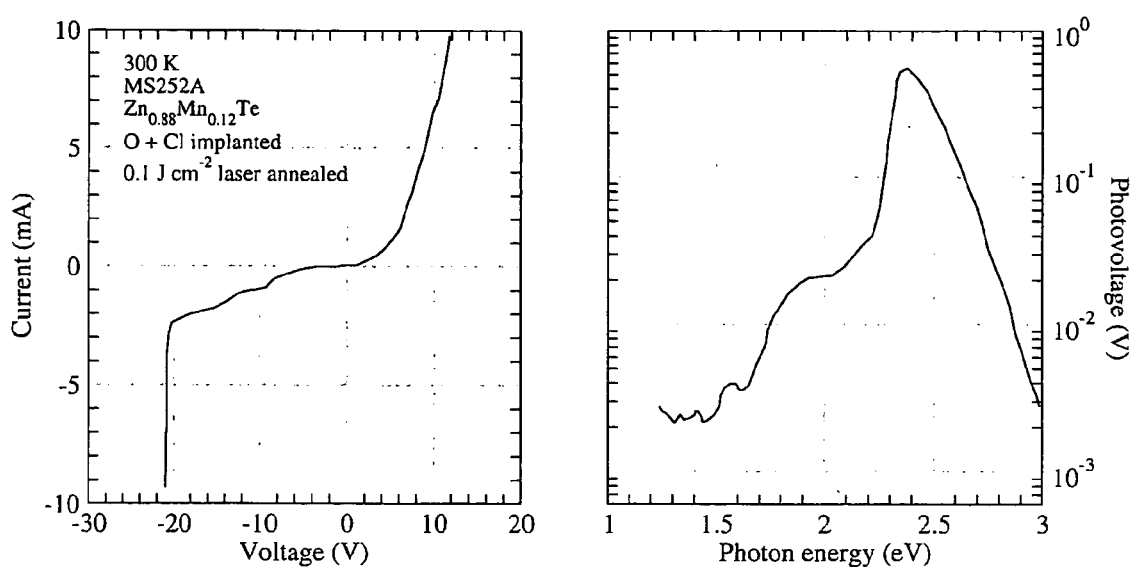
FIG. 5 displays current-voltage (I/V) characteristics and the spectral dependence of Photovoltage (PV) for a proptotypical p/n junction fabricated on the multiband semiconductor. The junction comprises a p– type $Zn_{0.88}Mn_{0.12}Te$ substrate implanted with O and Cl ions. The top implanted layer was pulsed laser melted. The O atoms partially replacing Te atoms form additional conduction band. The Cl ions substituting Te atoms provide n-type doping. The p/n junction is formed between the p-type substrate and the top n-type layer.

The formation of a p-n junction is illustrated by the rectifying behavior of a current-voltage (I-V) measurement as shown in FIG. 5. Also shown in FIG. 5 is the photovoltaic effect of this structure clearly showing the strong absorption at the lower band gap at ~1.7 eV.

Figure 6:
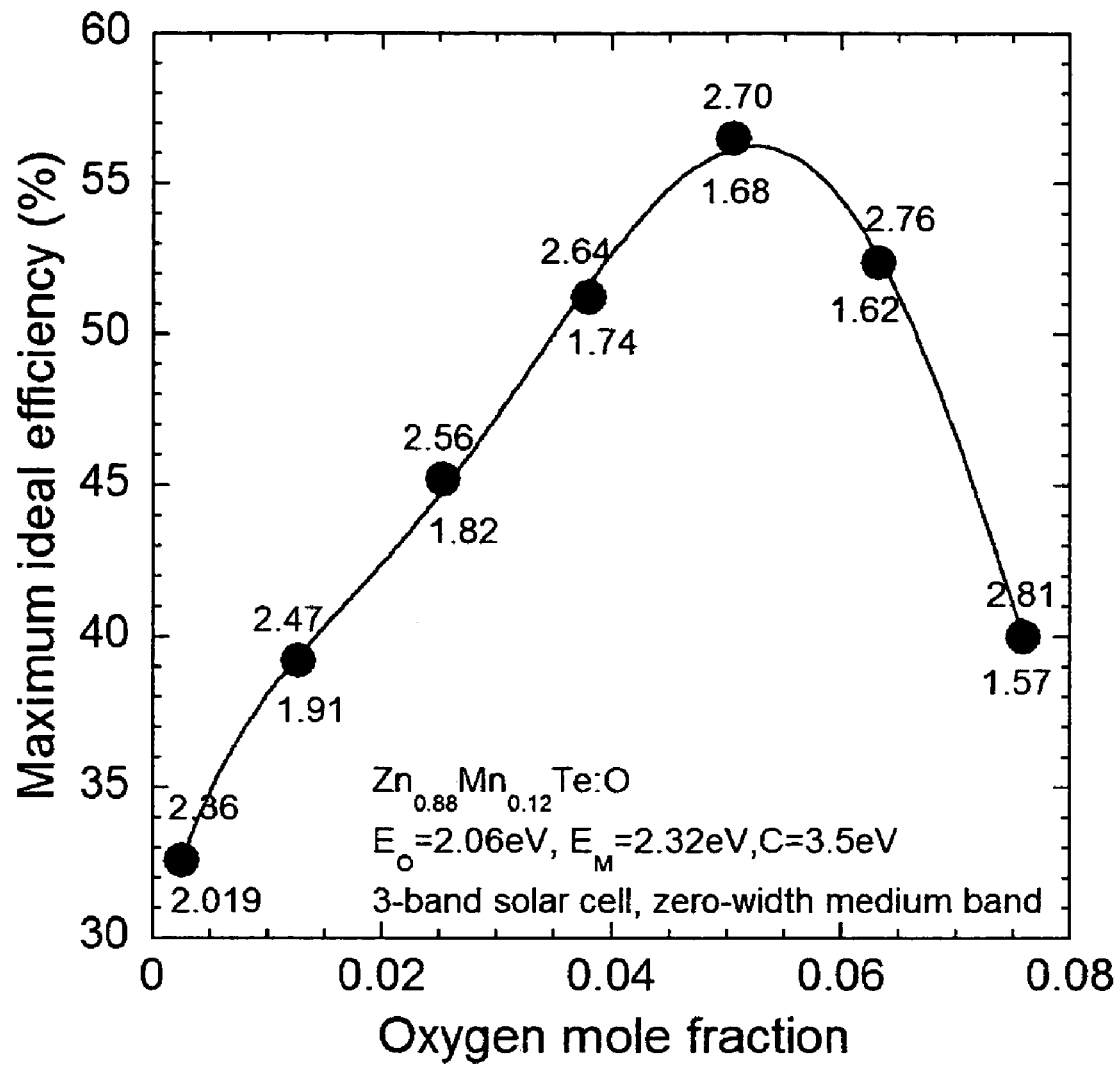
FIG. 6 shows the calculated power conversion efficiency for a solar cell fabricated from a 3-band $Zn_{0.88}Mn_{0.12}O_xTe_{1-x}$ alloy as a function of O content. The solid line is an empirical polynomial fit of the calculated data.

The present invention contemplates that by increasing x in $Zn_{0.88}Mn_{0.12}O_xTe_{1-x}$ to ~0.05 would increase the gap between $E^+$ and $E_-$ to 1 eV and leads to a power conversion efficiency of 56%. The calculated power conversion efficiency for a solar cell fabricated from a 3-band $Zn_{0.88}Mn_{0.12}O_xTe_{1-x}$ alloy as a function of O content is shown in FIG. 6.

Note that in the following examples it is preferred that the time period used for the heating be as short as possible. There is generally an inverse relationship between the time for heating and the temperature used. One of ordinary skill in the art can readily optimize the proper parameters for the particular Group II-VI semiconductor.

EXAMPLES

The band gap of the compositions and films made in accordance with the present invention was measured at room temperature using photomodulated reflectance (PR). Radiation from a 300 Watt halogen tungsten lamp dispersed by a 0.5 m monochromator was focused on the samples as a probe beam. A chopped HeCd laser beam (λ=442 or 325 nm) provided the photomodulation. PR signals were detected by a Si photodiode using a phase-sensitive lock-in amplification system. The values of the band gap and the line width were determined by fitting the PR spectra to the Aspnes third-derivative functional form, see D. E. Aspnes, *Surf. Sci.* 37, 418 (1973), the contents of which are hereby incorporated by reference in its entirety.

Example 1

(Group II)$_{(x)}$(A)$_{(1-x)}$(S or Se)$_{(1-y-z)}$(Te)$_{(y)}$(O)$_z$, and $0<x\leq1$, $0<z<0.04$ and $0<y<0.2$). The material may be fabricated as follows. A substrate of ZnSe$_{1-y}$Te$_y$ ($0<y<0.2$) is implanted with 1 to 4% of O. The top layer is melted with a short pulse of a laser light. The top layer, four band layer can be doped n-type to form a p/n junction with the p-type substrate.

Example 2

Preparation of a solar cell using the semiconductor materials described herein. A p-type substrate of Zn$_{1-y}$Mn$_y$Te (or similar material) may be implanted with 1 to 4 atomic % of O and 0 to 1 atomic % of Cl. The top implanted layer is then melted with a short laser pulse. The regrown n-type layer with electron concentration from $10^{17}$ to $10^{19}$ cm$^{-3}$ forms a p/n junction with the p substrate. A metal ohmic contact is formed on the back of the substrates. The front contact to the n-type layer is formed using a transparent conductor such as ZnO or InSnO alloys.

Example 3

Preparation of a (Group II)$_{(1-y)}$(A)$_y$O$_x$(Group VI)$_{(1-x)}$, and $0\leq y<1$ and $0<x<0.1$ and "A" comprises Mg. Multiple energy implantation using 90 and 30 keV O$^+$ was carried out into Zn$_{1-y}$Mn$_y$Te (y=0 and 0.12) single crystals to form ~0.2 μm thick layers with relatively constant O concentrations corresponding to O mole fractions of 0.0165-0.044. The O$^+$-implanted samples were pulsed-laser melted in air using a KrF laser (λ=248 nm) with a FWHM pulse duration ~38 ns, as described in K. M. Yu, W. Walukiewicz, M. A. Scarpulla, O. D. Dubon, J. Jasinski, Z. Liliental-Weber, J. Wu, J. W. Beeman, M. R. Pillai, and M. J. Aziz, J. Appl. Phys. 94, 1043 (2003), the contents of which are hereby incorporated by reference in its entirety. After passing through a multi-prism homogenizer, the fluence at the sample ranged between 0.020 and 0.3 J/cm$^2$. Some of the samples underwent RTA after the PLM at temperatures between 300 and 700° C. for 10 seconds in flowing N$_2$.

Example 4

Figure 7:
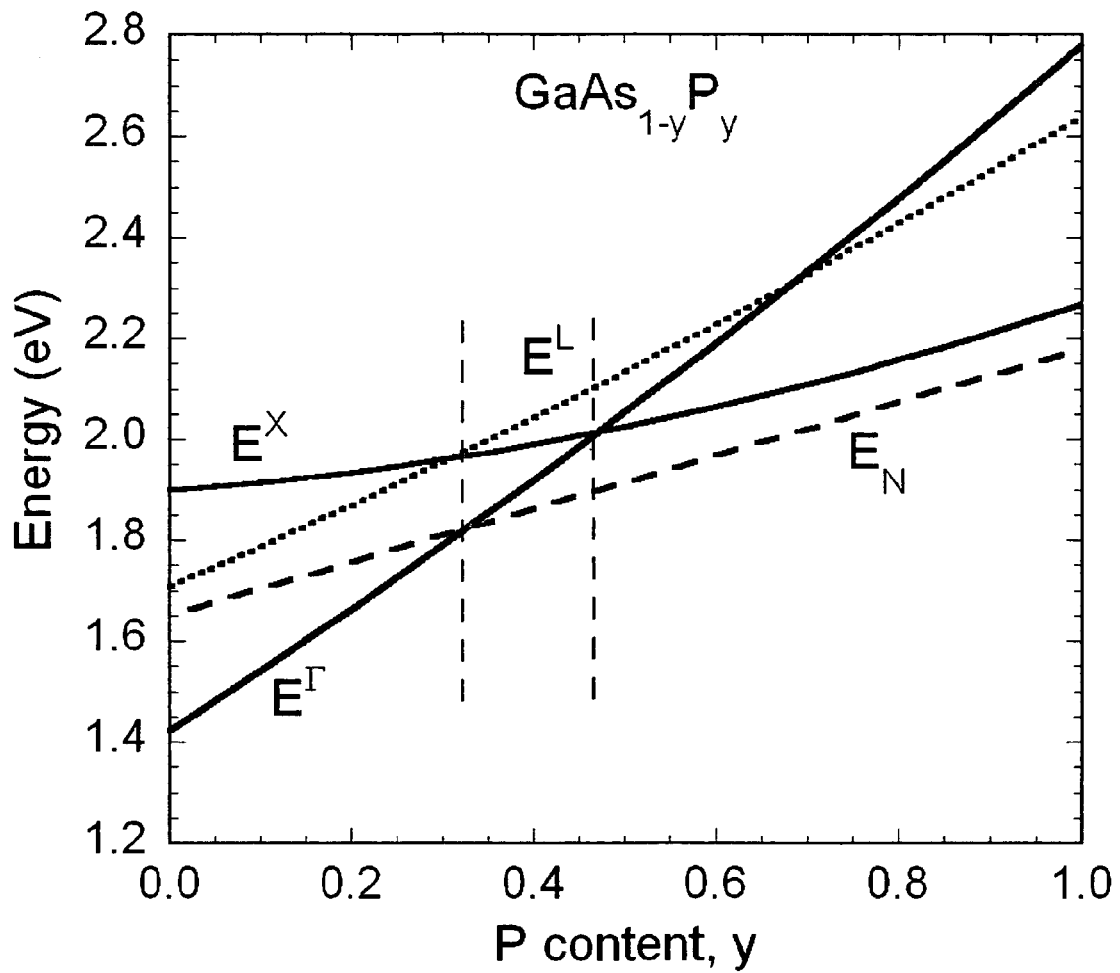
FIG. 7 shows the location of the nitrogen energy, $E_N$ level relative to the conduction band energy minima $E_\Gamma$ and $E_X$ in $GaN_xAs_{1-x-y}P_y$.

Preparation of GaN$_x$As$_{1-x-y}$P$_y$, where $0.3\leq y<0.5$ and $0<x<0.05$. Multiple energy implantation of N into GaAs$_{1-y}$P$_y$ ($0.3\leq y\leq0.5$) single crystals to form a thin layer with relatively constant N concentration corresponding to N mole fractions of $0<x<0.05$. The N$^+$-implanted samples are pulsed-laser melted with varying photon fluence. GaN$_x$As$_{1-x-y}$P$_y$, with $0.3\leq y<0.5$ and $0<x<0.05$ can be also grown using appropriate thin film growth epitaxial techniques including molecular beam epitaxy and metalorganic chemical vapor deposition. FIG. 7 shows the location of the nitrogen energy, $E_N$ level relative to the conduction band energy minima $E_\Gamma$ and $E_X$ in GaN$_x$As$_{1-x-y}$P$_y$. An intermediate nitrogen derived band is best formed when the $E_N$ falls below $E_\Gamma$ and $E_\Gamma$ is still below $E_X$ minimum. As seen in FIG. 7 this occurs for $0.4\leq y<0.6$.

Figure 8:
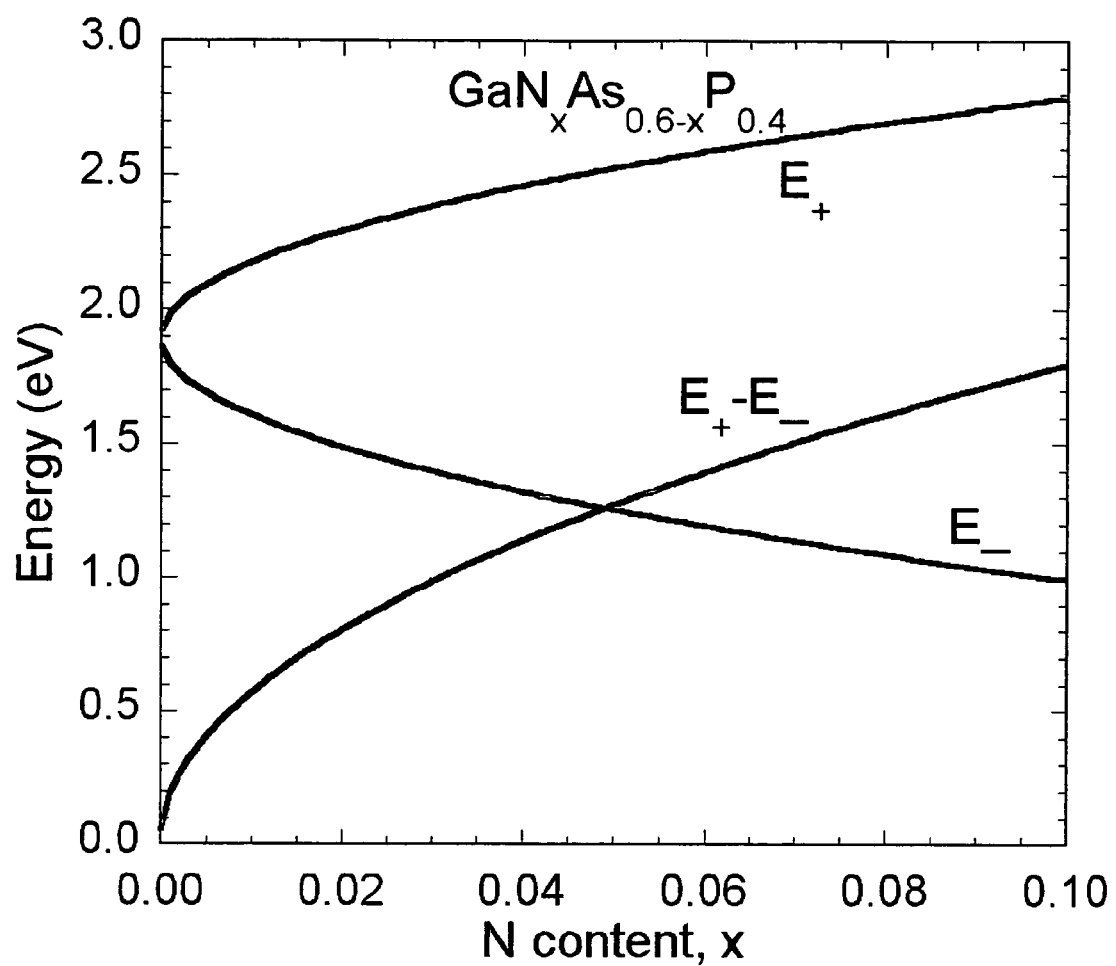
FIG. 8 shows the energies of the upper conduction $E_+$ and intermediate $E_-$ band in $GaN_xAs_{1-x-0.6}P_{0.4}$ as functions of the N-content x.

FIG. 8 shows the energies of the upper conduction E$^+$ and intermediate E$_-$ band in GaN$_x$As$_{1-x-0.6}$P$_{0.4}$ as functions of the N-content x. The curves were calculated using the band anti-crossing model. The curve E$_+$-E$_-$ represents the lowest absorption edge energy that can be adjusted with the N content for maximum solar cell efficiency.

Example 5

Preparation of Ga$_{1-y}$In$_y$N$_x$P$_{1-x}$ wherein $0.4\leq y<0.6$ and $0<x<0.05$. Multiple energy implantation of N into Ga$_{1-y}$In$_y$P ($0.4\leq y\leq0.6$) single crystals to form a thin layer with relatively constant N concentration corresponding to N mole fractions of $0<x<0.05$. The N$^+$-implanted samples are pulsed-laser melted with varying photon fluence. Ga$_{1-y}$In$_y$N$_x$P$_{1-x}$, with $0.3\leq y<0.5$ and $0<x<0.05$ can be also grown using appropriate thin film growth epitaxial techniques including molecular beam epitaxy and metalorganic chemical vapor deposition.

While not wishing to be bound by any particular theory or principle, it is believed that the unusual and unexpected properties of HMA semiconductors described in the present invention are explained by the recently developed band anti-crossing (BAC) model, see W. Shan, W. Walukiewicz, J. W. Ager III, E. E. Haller, J. F. Geisz, D. J. Friedman, J. M. Olson, and S. R. Kurtz, *Phys. Rev. Lett.* 82, 1221(1999), the contents of which are hereby incorporated herein by reference. According to this model the electronic structure of the HMAs is determined by the interaction between localized states associated with N or O atoms and the extended states of the host semiconductor matrix. As a result the conduction band splits into two subbands with distinctly non-parabolic dispersion relations.

CONCLUSION

Although the foregoing invention has been described in some detail for purposes of clarity of understanding, those skilled in the art will appreciate that various adaptations and modifications of the just described preferred embodiments can be configured without departing from the scope and spirit of the invention. Therefore, the described embodiments should be taken as illustrative and not restrictive, and the invention should not be limited to the details given herein but should be defined by the following claims and their full scope of equivalents.

What is claimed is:

1. A semiconductor composition comprising:
   a ternary or quaternary alloy,
   said alloy comprising a Group II element, a Group VI element, Oxygen and optionally a third element "A", wherein
   said alloy has a mole fraction composition of (Group II)$_{(1-y)}$(A)$_y$O$_x$(Group VI)$_{(1-x)}$, and $0\leq y<1$ and $0<x<1$ and "A" comprises Mg; and
   wherein said alloy further comprises O derived narrow band to expand absorption to full solar spectrum.

2. The semiconductor composition of claim 1, wherein the alloy comprises: Zn$_{0.88}$A$_{0.12}$O$_x$Te$_{l-x}$, and $0<x<0.05$.

3. The semiconductor composition of claim 2, wherein x is between about 0.01 and 0.05.

4. The semiconductor composition of claim 3, wherein x is between about 0.02 and 0.04.

5. The semiconductor composition of claim 1, wherein the alloy comprises: Cd$_{l-y}$Mg$_y$O$_x$Te$_{l-x}$, $0<y<1$ and $0<x<0.05$.

6. The semiconductor composition of claim 5, wherein x is between about 0.01 and 0.05.

7. The semiconductor composition of claim 5, wherein x is between about 0.02 and 0.04.

8. A semiconductor composition comprising:
a ternary or quaternary alloy,
said alloy comprising a Group II element, a Group VI element, Oxygen and optionally a third element "A", wherein
said alloy has a mole fraction composition of $(\text{Group II})_{(1-y)}(A)_y O_x (\text{Group VI})_{(1-x)}$, and $0 \leq y < 1$ and $0 < x < 0.05$ and "A" comprises either Mn or Mg, and wherein the Group II element does not comprise Cd; and
wherein said alloy further comprises O derived narrow band to expand absorption to full solar spectrum.

9. The semiconductor composition of claim 8, wherein the alloy comprises: $Zn_{0.88}A_{0.12}O_x Te_{1-x}$, and $0 < x < 0.05$.

10. The semiconductor composition of claim 9, wherein x is between about 0.01 and 0.05.

11. The semiconductor composition of claim 10, wherein x is between about 0.02 and 0.04.

12. A semiconductor composition comprising:
a Group II element, optionally another Element "A"; further comprising either S or Se, and further comprising oxygen and tellurium, wherein said composition has a mole fraction composition of $(\text{Group II})_{(x)}(A)_{(1-x)}(\text{S or Se})_{(1-y-z)}(\text{Te})_{(y)}(O)_z$ and $0 < x < 1$, $0 < z < 0.04$ and $0 < y < 0.02$; and
wherein said composition further comprises O derived narrow band to expand absorption to full solar spectrum.

13. The semiconductor composition of claim 12, wherein the composition comprises $Zn_x Mn_{1-x} Se_{(1-y-z)} Te_y O_z$, and $0 < x < 1$, $0 < z < 0.04$ and $0 < y < 0.2$).

14. The semiconductor composition of claim 13, wherein Z is between about 0.01 and 0.04.

15. The semiconductor composition of claim 14, wherein z is between about 0.02 and 0.04.

16. A photovoltaic device comprising the composition of claim 1, thereby providing an efficient solar cell.

17. A photovoltaic device comprising the composition of claim 8, thereby providing an efficient solar cell.

18. A photovoltaic device comprising the composition of claim 12, thereby providing an efficient solar cell.

* * * * *